United States Patent [19]
Park

[11] Patent Number: 6,068,317
[45] Date of Patent: May 30, 2000

[54] DEVICE FOR ADJUSTING SPACE BETWEEN CHIP IN SEMICONDUCTOR CHIP TESTER

[75] Inventor: Woo Yeol Park, Chungcheongnam-do, Rep. of Korea

[73] Assignee: Mirae Corporation, Chungcheongnam-do, Rep. of Korea

[21] Appl. No.: 09/164,017

[22] Filed: Sep. 30, 1998

[30] Foreign Application Priority Data

Nov. 8, 1997 [KR] Rep. of Korea ............... 97/58889

[51] Int. Cl.⁷ ................................. B65B 35/38
[52] U.S. Cl. ............... 294/87.1; 294/65; 414/752.1
[58] Field of Search ............ 294/87.1, 65, 64.1; 414/941, 901, 752

[56] References Cited

U.S. PATENT DOCUMENTS

| | | | |
|---|---|---|---|
| 4,597,819 | 7/1986 | Kusuhara et al. | 294/87.1 |
| 4,695,217 | 9/1987 | Lau | 294/87.1 |
| 4,957,406 | 9/1990 | Akagawa | 294/87.1 |
| 5,273,152 | 12/1993 | Brun | 294/87.1 |
| 5,284,413 | 2/1994 | Wilkinson et al. | 294/65 |
| 5,290,134 | 3/1994 | Baba | 294/87.1 |
| 5,575,376 | 11/1996 | Colamussi | 294/65 |
| 5,755,473 | 5/1998 | Swain et al. | 294/87.1 |
| 5,839,769 | 11/1998 | Slocum et al. | 294/87.1 |
| 5,851,296 | 12/1998 | Haraguchi et al. | 414/941 |
| 5,919,024 | 7/1999 | Fujimori | 414/752 |

*Primary Examiner*—Dean J. Kramer
*Assistant Examiner*—Paul T. Chin
*Attorney, Agent, or Firm*—Sheridan Ross P.C.

[57] ABSTRACT

Device for adjusting a space between chips in a semiconductor chip tester, is disclosed, including a carrier plate mounted movable along a horizontal guide rail, a mounting plate fixed to the carrier plate, an elevating plate mounted on the mounting plate movable in up and down direction by a vertical LM (linear motion) guider, a cam shaft rotatably mounted on the elevating plate, the cam shaft having a plurality of cam grooves formed in a radial direction in an outer circumferential surface, a driving mechanism for rotating the cam shaft, and a plurality of pick-up members each fitted movable in a horizontal direction by a horizontal LM guider in a state a top of each of the pick-up members is inserted in one of the cam grooves.

4 Claims, 16 Drawing Sheets

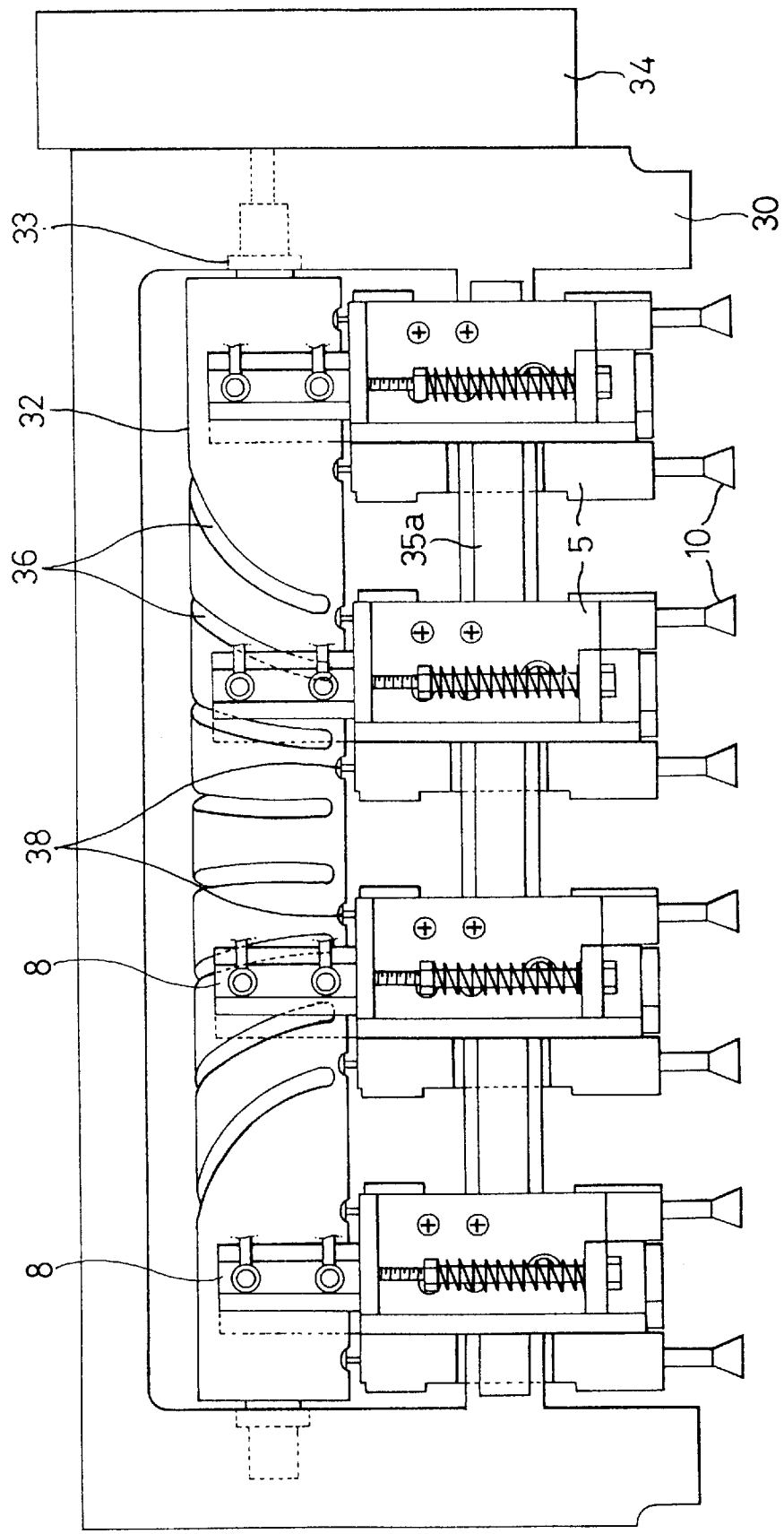

DEVICE FOR ADJUSTING SPACE BETWEEN CHIP IN SEMICONDUCTOR CHIP TESTER

BACKGROUND OF THE INVENTION

1. Field of the Invention

The present invention relates to a device for adjusting a space between chips in a semiconductor chip tester for testing performances of a semiconductor chip fabricated in a semiconductor process, in which a space between the chips is adjusted to suit to a pitch of a recesses in a position determining block when the chip put in a custom tray is adsorbed and transported toward the position determining block.

2. Discussion of the Related Art

In general, the custom tray of plastic having chips put therein for safekeeping or transportation between steps of chip fabrication is different in shape, size, capacity, pitch between recesses for putting the chips therein depending on manufacturers. Since the purpose of the recess in the custom tray is just putting in the chip, the space is formed without any high precision. However, the recess in a test tray for putting in the chip to be tested therein is formed with a high precision for making a perfect contact of the chip loaded in the test tray with a test connector (a connector for electrically connecting leads on the chip and the tester). Therefore, in order to make an accurate loading of the chip in the recess in the custom tray onto the recess in the test tray, a position determining block of a high accuracy should be used separately for accurate alignment of the chip position. To do this, the semiconductor chip tester is provided with a transportation means with a pick-up for transportation of chips. FIGS. 1 to 4 illustrate an art developed by the applicant and filed in Korea with an utility model application No. 95-7512. The aforementioned art will be explained with reference to FIGS. 1 to 4.

In the tester, there are a top plate 1 having a mounting plate 3 fitted thereto to be movable along a first horizontal LM guider 2 and a pick-up block 5 mounted under the mounting plate 3 for moving in up and down direction according to a movement of a first cylinder 4. And, there are a plurality of sliders 7 fitted to the pick-up block 5 each for moving along a second horizontal LM guider 6 in a direction the same with the direction of the mounting plate 3 movement, and each of the sliders 7 has a pick-up head 11 adapted to be guided by a vertical LM guider 9 in moving in an up and down direction according to a movement of a second cylinder 8. There is a pick-up 10 at a bottom of each of the pick-up heads 11 for adsorbing a chip 20 by a vacuum. As shown in FIGS. 3 and 4, there are pins 12 fixed to top of each slider 7 and exposed through a long hole 5a in top of the pick-up block 5, to make a hinge coupling with a first link 13 at a center thereof, each end of which first link 13 has a pin 15 connected to one end of a two pieced second link 14 for interlocked movement of the first, and second links 13 and 14. There is a guide piece 17 with a guide groove 17a for moving in a left and right direction according to a movement of a cylinder 16, and there is a projection 18 at one end of the first link at a middle of the first link inserted in the guide groove 17a.

The background art device for adjusting a space between chips having the aforementioned system starts operation in a condition when the pick-up 10 for adsorbing the chip 20 in the recess 19a of the custom tray 19 is at a top dead center and the slider 7 is drawn inwardly. When the mounting plate 3 moved along the first LM guider 2 comes to match with a first column of the recesses in the custom tray 19, movement of the slider 7 is stopped by a sensor. Under this condition, the first cylinder 4 fixed to the mounting plate 3 is driven to move the pick-up block 5 down to a bottom dead center, when the second cylinder 8 fixed to each slider 7 for moving the pick-up head 11 in an up and down direction is operated. According to this, the pick-up at one end of the pick-up head 11 moves downward as shown in one dotted chain lines in FIG. 2 until the pick-up makes contact with top of the chip 20 in the recess 19a of the custom tray 19. Then, the chip 20 in the recess 19a of the custom tray 19 is adsorbed to the pick-up 10 when a vacuum is established inside of the pick-up 10. While the chip 20 is adsorbed, the second cylinder 8 and the first cylinder 4 are operated in a sequence opposite to the aforementioned sequence, returning the pick-up head 11 and the pick-up block 5 to the top dead center the same as the initial state. Then, the mounting plate 3 is moved toward the position determining block along the first horizontal LM guider 2, when the third cylinder 16 fixed to top of the pick-up block 5 is driven to push the guide piece 17, moving the pin 18 fixed at one end of the first link 13 outwardly along the guide groove 17a in the guide piece as shown in FIG. 4. According to this, as shown in FIGS. 1 and 4, the first, and second links 13 and 14 drawn inwardly are opened outwardly until the pick-up is identical to a pitch of the recesses in the test tray. Under this condition, the first, and second cylinders 4 and 8 are driven in succession, to position the pick-up 10 down to the bottom dead center, positioning the chip adsorbed to the pick-up 10 in the recess of the position determining block (not shown). Upon releasing the vacuum in the pick-up, the chip at the pick-up is dropped into the recess of the position determining block, exactly. This background art device can shorten a time period of position determination by implementing operations of adsorbing one column of chips in the custom tray at a time, position determining by adjusting spaces between the chips during transportation toward the position determining block, and loading the chips of which positions are determined on the test tray by means of one transportation device. And, a space for installing the tester can be minimized.

However, though the pick-ups 10 at opposite sides of the tester can be positioned right over the recesses of the position determining block or the test tray exactly when the sliders 7 are fully drawn apart because the sliders 7 are interlocked with the plurality of the first, and second links 13 and 14, the pick-ups 10 between the opposite side pick-ups 10 can not be so because ends of the links can be positioned inaccurately due to flexibility of comparatively long lengths of the links. Due to this, there has been a fatal problem that the chips at ends of the pick-ups are loaded in the recesses of the position determining block, inaccurately. The complicated system with many components requires much machining and assembling time period.

In order to improve the aforementioned problems, an art illustrated in FIGS. 5 and 6 is developed again, and filed a utility model with an application number 96-22005 in Korea, which will be explained in detail.

There are a plurality of links 21 and 22 having first inserting holes 21a and 22a respectively, in each of which holes 21a and 22a a shaft 23 fixed to the slider 7 is inserted. The links 21 and 22 have second inserting holes 21b and 22b at the other ends respectively, in which holes 21b and 22b a pin 24 for interconnecting the links 21 and 22 are inserted. Accordingly, when the sliders 7 are drawn inward, that is, referring to FIG. 6a, when the pins 24 connecting the links 21 and 22 come closer to the shafts 23 fixed to the sliders 7, with the links crossed to each other, the plurality of sliders 7 can be packed together. Under this condition, when the mounting plate 3 is moved to be matched with one column of recesses of the custom tray, the first cylinder 4 fixed to the mounting plate 3 is driven, moving the pick-up block 5 down to the bottom dead center. On the same time, the second cylinder 8 is driven, moving the pick-up head 11 downward until the pick-up 10 at an end thereof is brought into contact with top of the chip 20 in the recess 19*a* of the custom tray 19, when the pick-up adsorbs the chip 20 by a vacuum. When the chip 20 is adsorbed to the pick-up 10 in the aforementioned operation, the second cylinder 8 and the first cylinder 4 are driven in succession opposite to the aforementioned operation, elevating the pick-up head 11 and the pick-up block 5 upward the same as the initial stage, respectively. On the same time with this, the mounting plate 3 is moved toward the position determining block along the first horizontal LM guider 2, when the third cylinder 16 is driven, pushing the guide piece 17 to draw the links 21 and 22 apart. According to this, the sliders 7 fixed to the links 21 and 22 are also drawn apart, with the chips adsorbed to the pick-ups 10 matched with the recesses of the position determining block. In the foregoing operation, as shown in FIG. 6*b*, since the pins 24 connecting the links 21 and 22 come closer to the shafts 23 fixed to the sliders 7, spaces between the plurality of sliders 7 can be constant. Since this system has the shaft 23 fixed the slider 7 closer to the pin 24 connecting the links 21 and 22, distances between the pick-ups 10 can be maintained constant.

However, because this second exemplary background art device has a number of components greater than the first exemplary background art device, an exact pitch can not be obtained due to a cumulative tolerance in fabrication and assembly. The errors between pick-ups becoming serious from wear of links and bearings in a prolonged use of the device has been a cause of noise.

SUMMARY OF THE INVENTION

Accordingly, the present invention is directed to a device for adjusting a space between chips in a semiconductor chip tester that substantially obviates one or more of the problems due to limitations and disadvantages of the related art.

An object of the present invention is to provide device for adjusting a space between chips in a semiconductor chip tester which allows an exact space adjustment of pick-ups within a short time period as required.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the device for adjusting a space between chips in a semiconductor chip tester includes a carrier plate mounted movable along a horizontal guide rail, a mounting plate fixed to the carrier plate, an elevating plate mounted on the mounting plate movable in up and down direction by a vertical LM guider, a cam shaft rotatably mounted on the elevating plate, the cam shaft having a plurality of cam grooves formed in a radial direction in an outer circumferential surface, driving means for rotating the cam shaft, and a plurality of pick-up means each fitted movable in a horizontal direction by a horizontal LM guider in a state a top of each of the pick-up means is inserted in one of the cam grooves.

In other aspect of the present invention, there is provided a device for adjusting a space between chips in a semiconductor chip tester, including a carrier plate mounted movable along a horizontal guide rail, a mounting plate fixed to the carrier plate, an elevating plate mounted on the mounting plate movable in up and down direction by a vertical LM (linear motion) guider, a cam plate mounted on the elevating plate movable in forward and backward directions, the cam plate having a plurality of cam grooves formed in a radial direction in a bottom surface thereof guide means for guiding a movement of the cam plate in the forward and backward direction, driving means fixed to one side of the cam plate for moving the cam plate in the forward and backward directions, and a plurality of pick-up means each fitted movable in a horizontal direction by a horizontal LM guider in a state a top of each of the pick-up means is inserted in one of the cam grooves.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 6*a* and 6*b* are plan and sectional views of the device of FIG. 5, respectively, wherein FIG. 6*a* illustrates links drawn inward, FIG. 6*b* illustrates links drawn apart;

FIGS. 12*a* and 12*b* illustrate operation of the device in accordance with one embodiment of the present invention;

DETAILED DESCRIPTION OF THE PREFERRED EMBODIMENT

Figure 1:
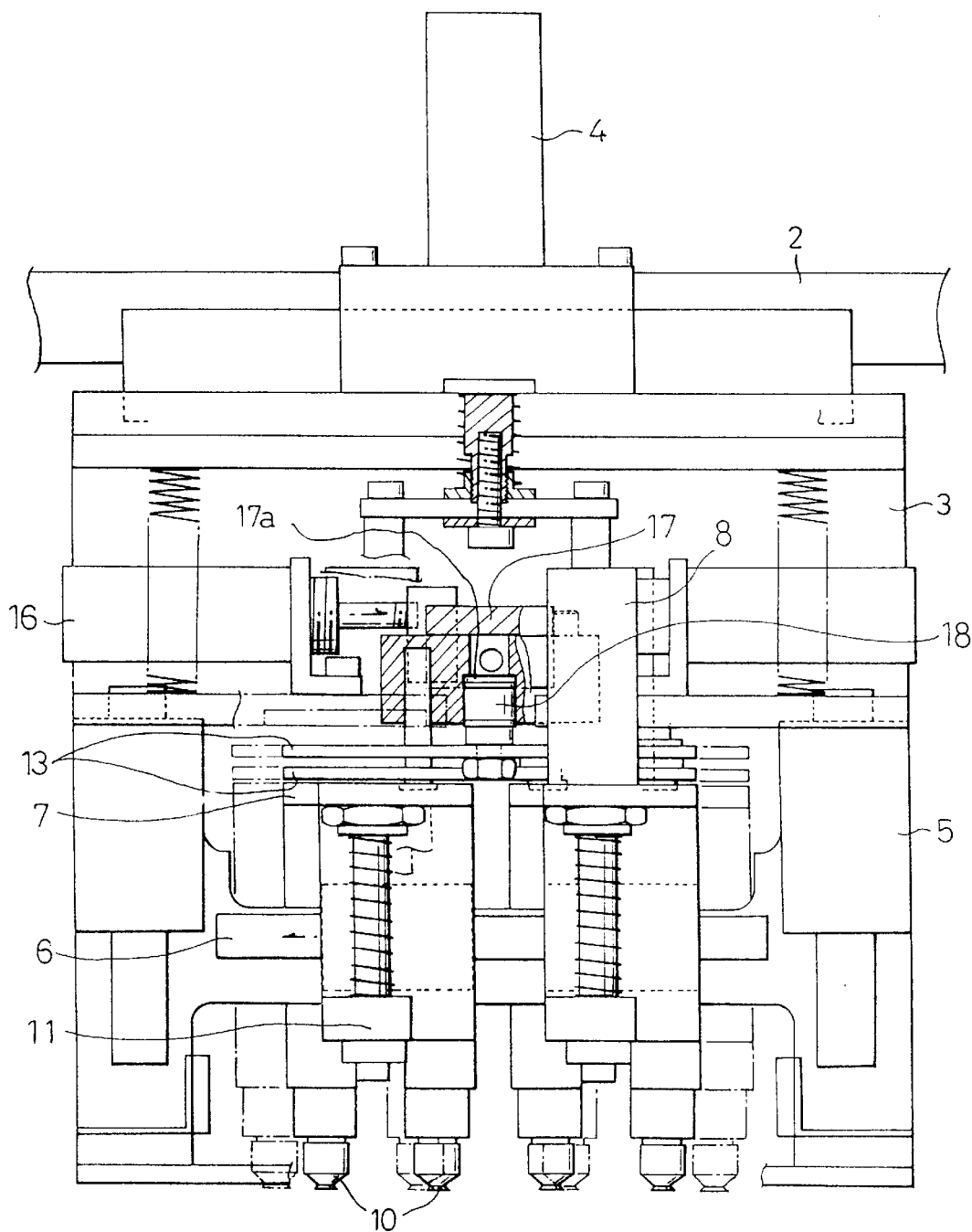
FIG. 1 illustrates a front view of a first exemplary background art device with a partial cut away view.
Figure 2:
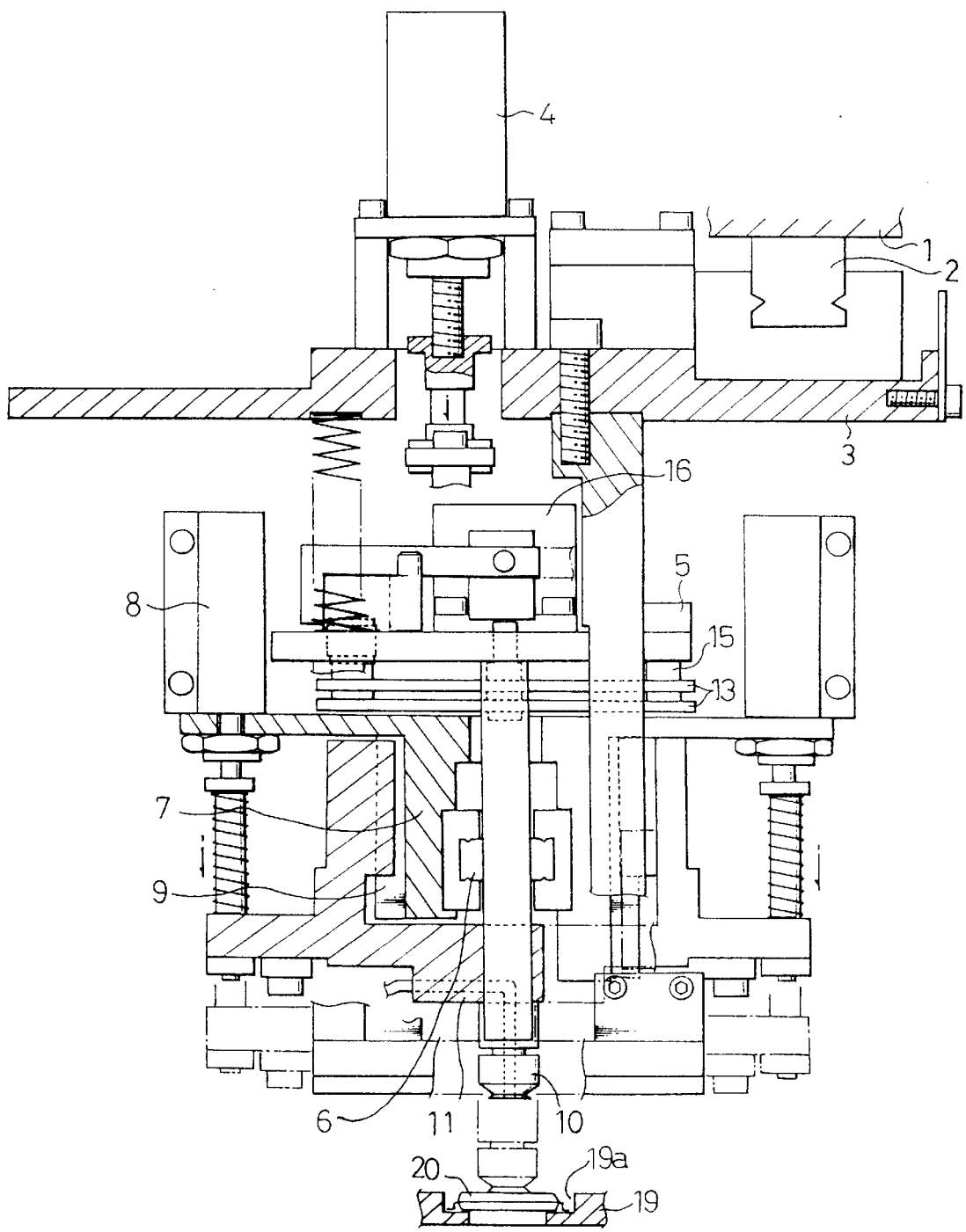
FIG. 2 illustrates a side view of an exemplary background art device of FIG. 1 with a partial cut away view.
Figure 3:
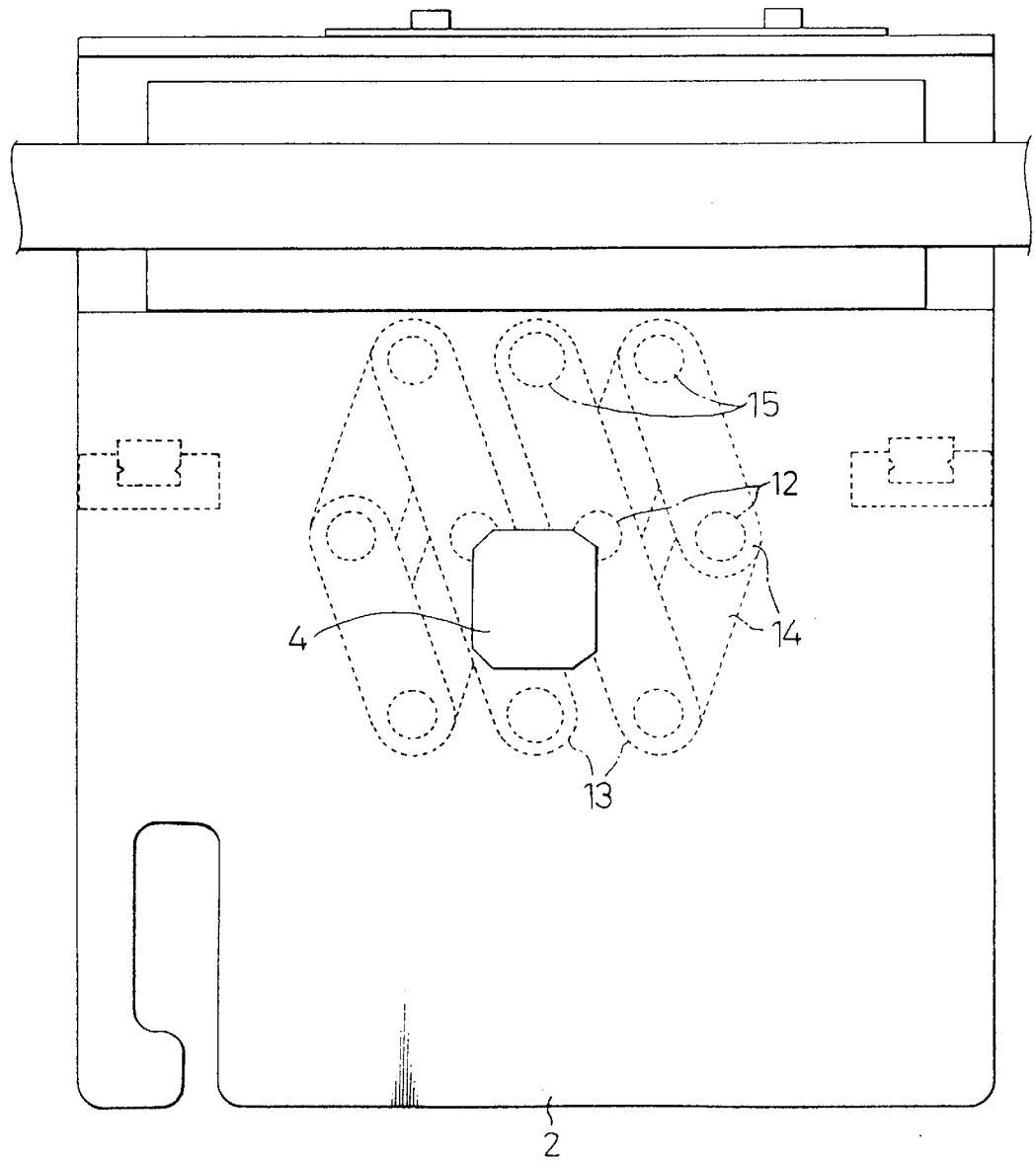
FIG. 3 illustrates a state the sliders are drawn inward.
Figure 4:
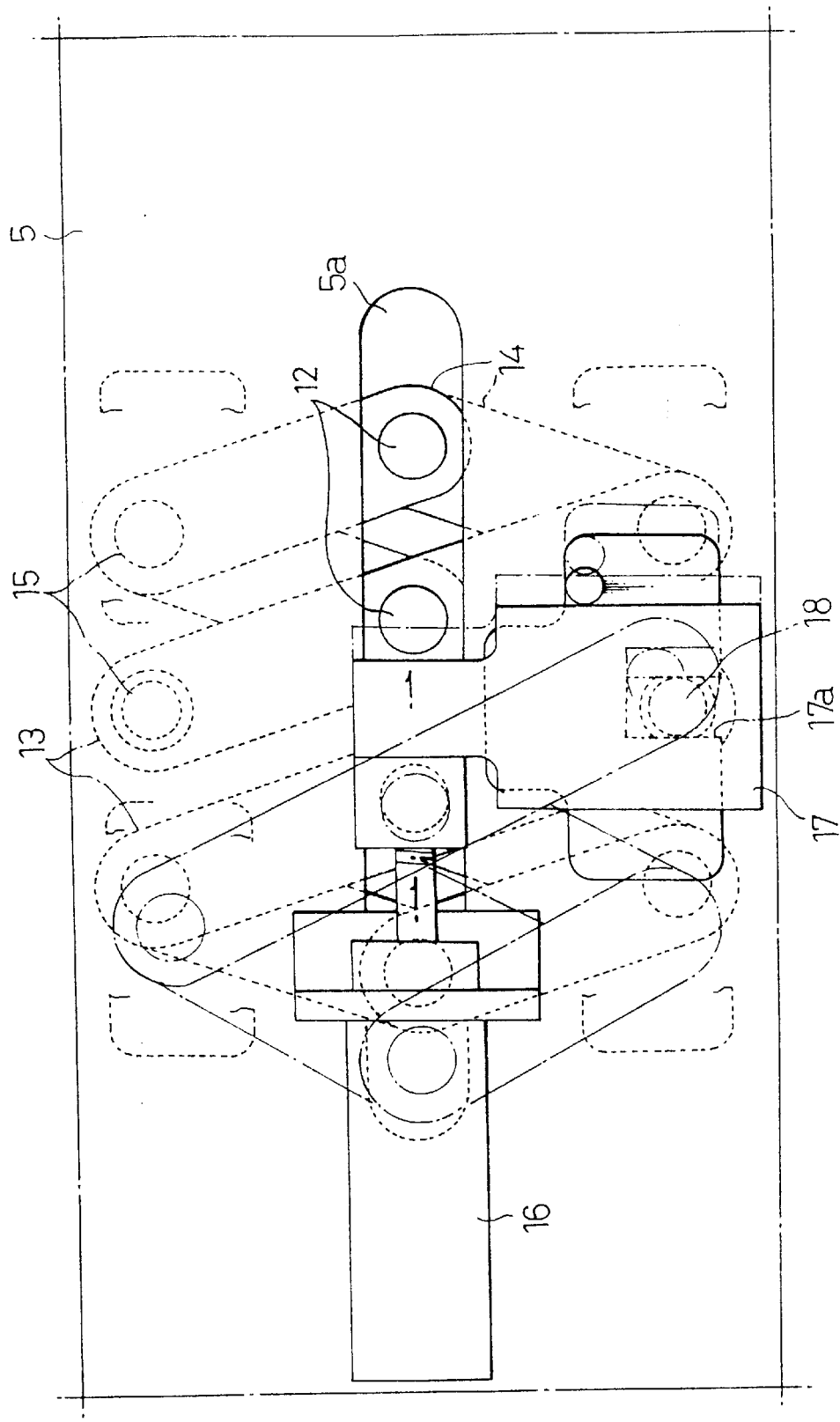
FIG. 4 illustrates a state the sliders are drawn apart by the third cylinder.
Figure 5:
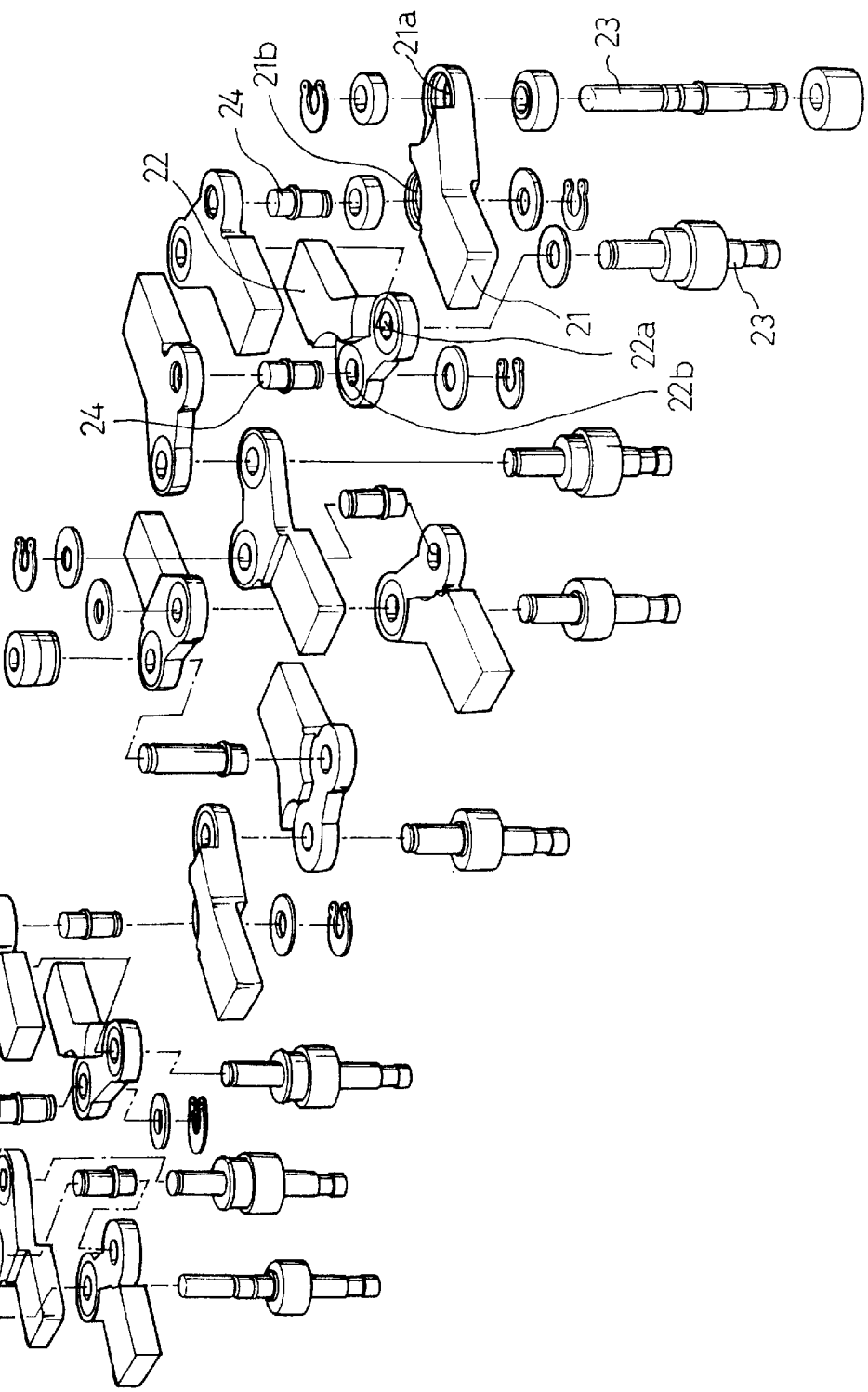
FIG. 5 illustrates a perspective view of another exemplary background art device with a partial cut away view.
Figure 6A:
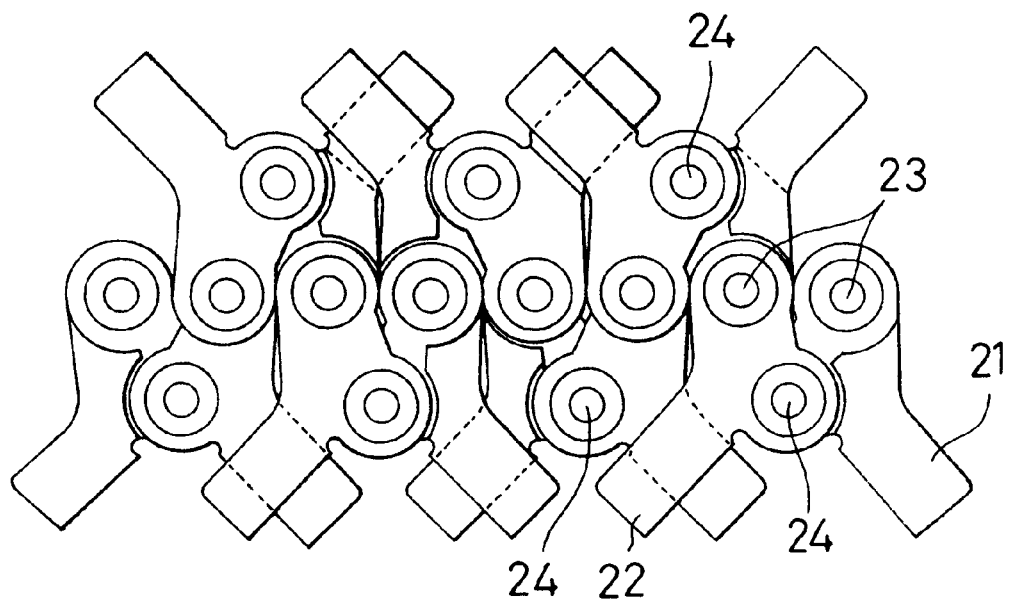
Figure 6A:
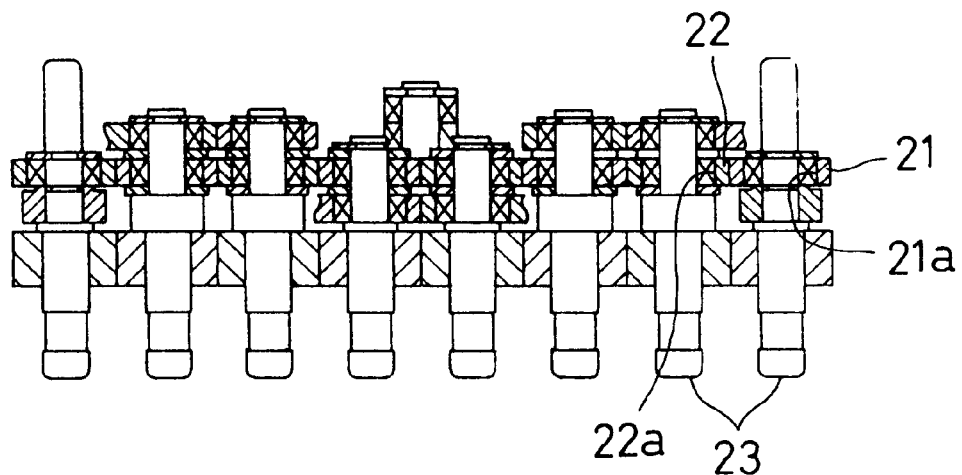
Figure 6B:
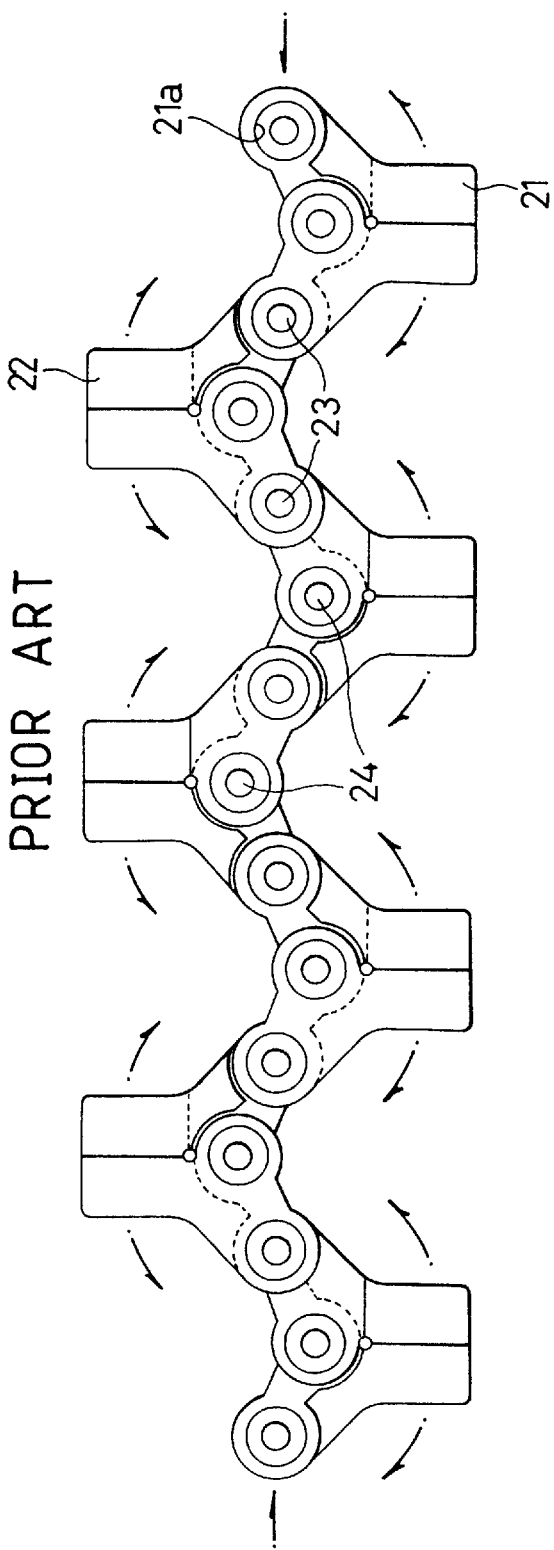
Figure 6B:
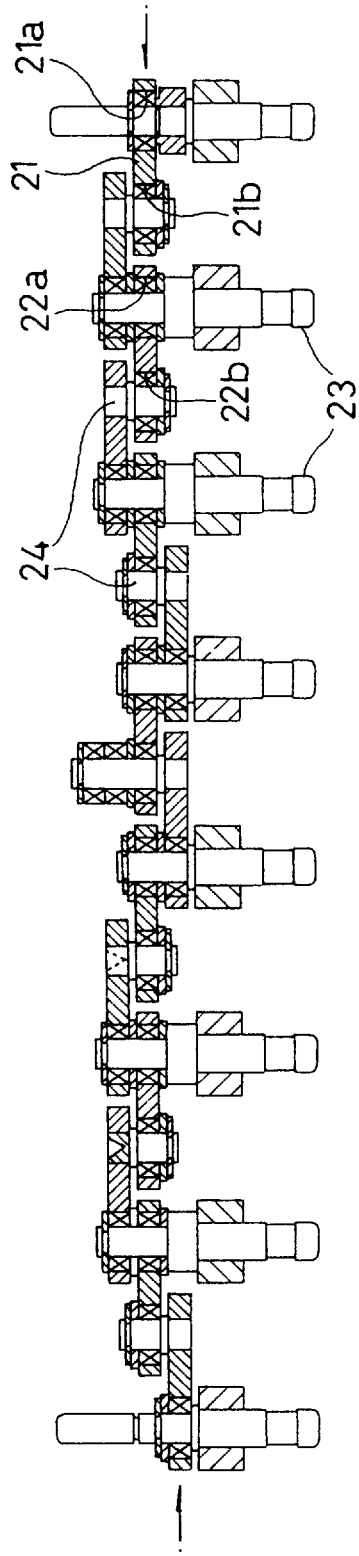
Figure 7:
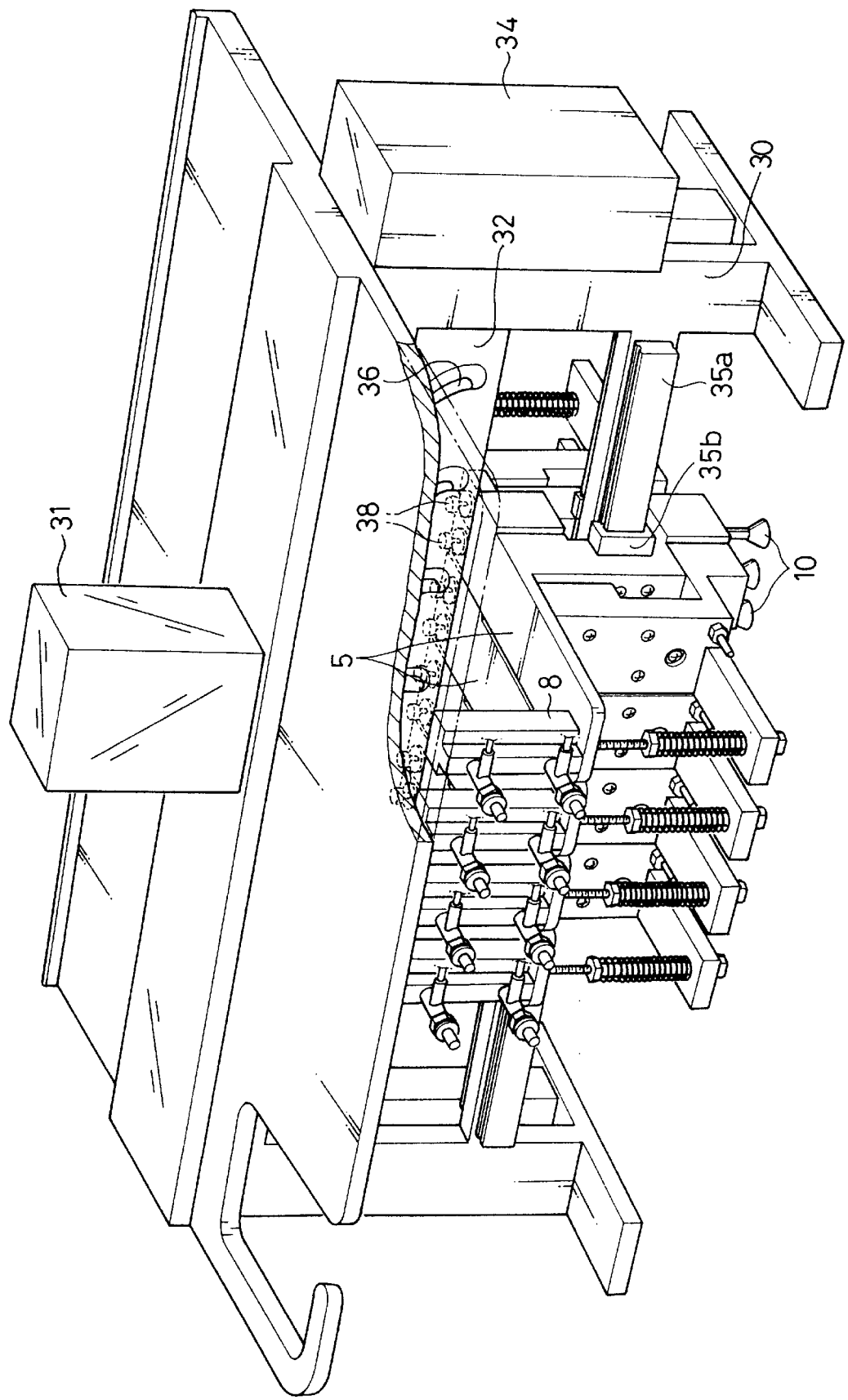
FIG. 7 illustrates a perspective view showing a first preferred embodiment of the present invention.
Figure 8:
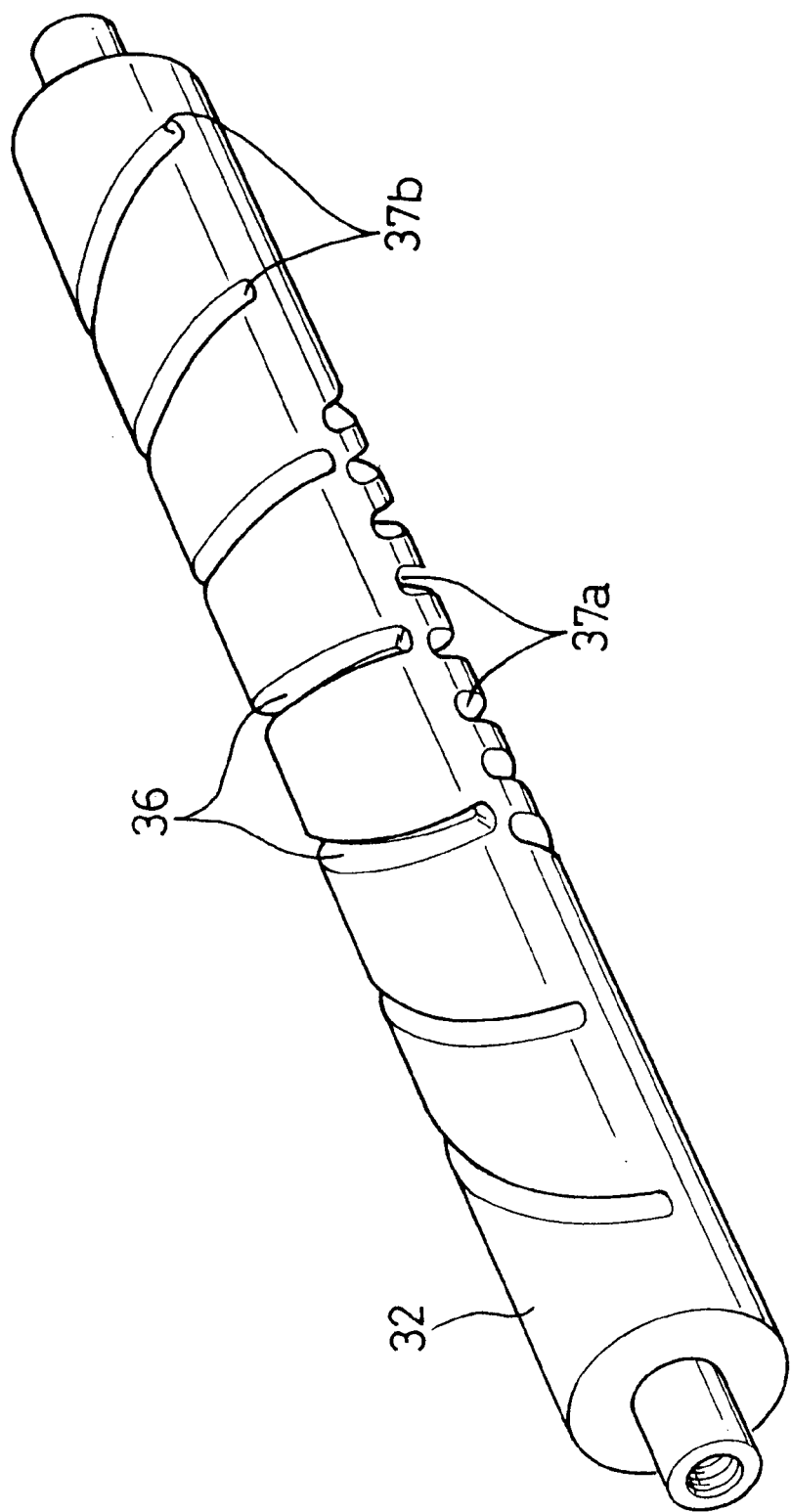
FIG. 8 illustrates a perspective view showing a cam shaft, a key part of the present invention.
Figure 9:
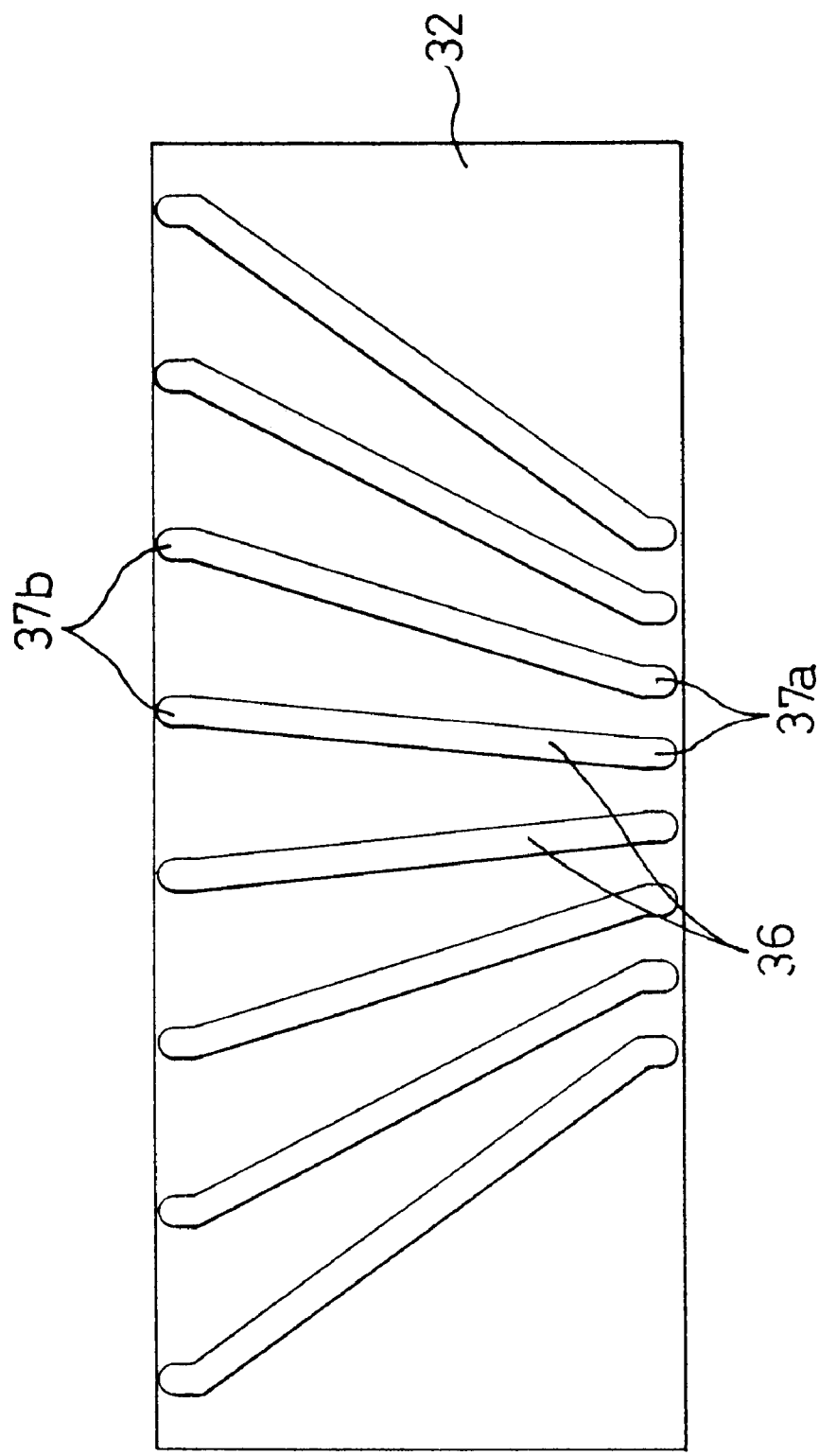
FIG. 9 illustrates a developed view showing cam grooves in a cam shaft.

Reference will now be made in detail to the preferred embodiments of the present invention, examples of which are illustrated in the accompanying drawings. FIG. 7 illustrates a perspective view showing a first preferred embodiment of the present invention, FIG. 8 illustrates a perspective view showing a cam shaft, a key part of the present invention, and FIG. 9 illustrates a developed view showing cam grooves in a cam shaft.

Figure 13:
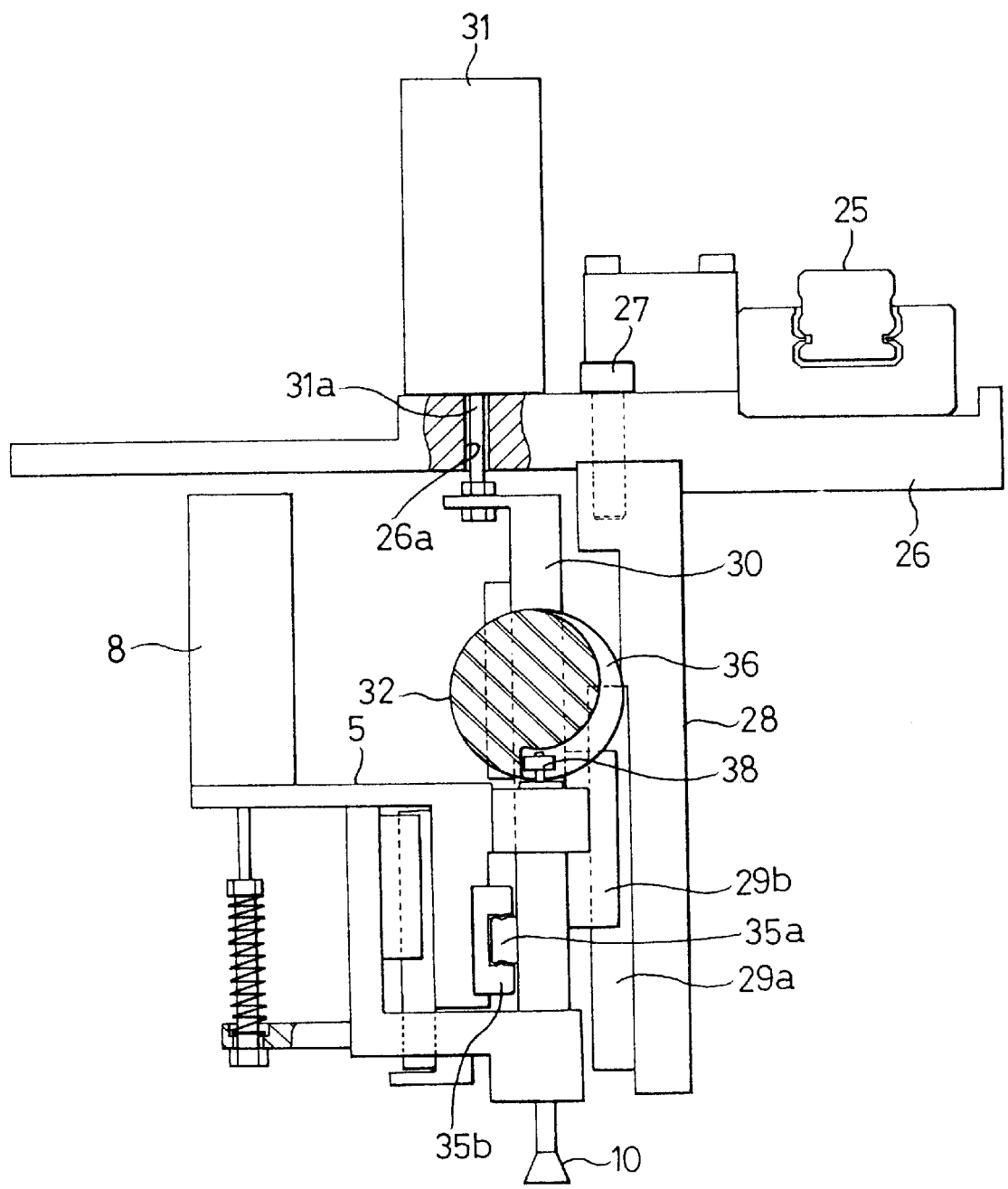
FIG. 13 illustrates a side view with partial cut away views of a portion of the device of FIG. 12*a*; and, FIG. 14 illustrates a perspective view showing another embodiment of the present invention.

As shown in FIG. 13, there is a carrier plate 26 mounted on a guide rail 25 in a chip tester body (not shown) for moving in a horizontal direction, and a mounting plate 28 fitted vertical to the carrier plate 26 with a fastening member 27. The vertical LM guider 29a fixed to the mounting plate 28 has another vertical LM guider 29b fixed to an elevating plate 30 and coupled thereto, so that one pair of the vertical LM guiders 29a and 29b guide the elevating plate in moving in an up and down direction of the mounting plate 28. There is a cylinder 31 mounted on the carrier plate 26 having a rod 31a a far end of which is connected to the elevating plate 30 through a hole 26a in the carrier plate 26. Accordingly, the elevating plate 30 can make a stable up and down movement guided by the vertical LM guiders 29a and 29b as the cylinder 31 is driven. As shown in FIG. 8, there is a cam shaft 32 supported on bearings mounted in the elevating plate 30 for rotating the cam shaft 32 when a driving means fitted at one side of the cam shaft is driven. Though the cam shaft 32 is adapted to be rotated by means of a rotating cylinder 34 driven by compressed air in one embodiment of the present invention, the means for driving the cam shaft 32 is not limited to this because the cam shaft 32 may be driven by a hydraulic pressure or step motor. And, there are a horizontal LM guider 35a at one or both sides of the elevating plate 30 each coupled with another horizontal LM guider 35b fixed to one side of pick-up means, so that a plurality of pick-up means can make a horizontal movement along the horizontal LM guiders 35a and 35b. Pick-up means are fitted with tops of the pick-up means inserted in cam grooves in the cam shaft 32 so that a space between the pick-up means becomes greater or smaller as the cam shaft 32 is driven by the driving means.

Figure 10:
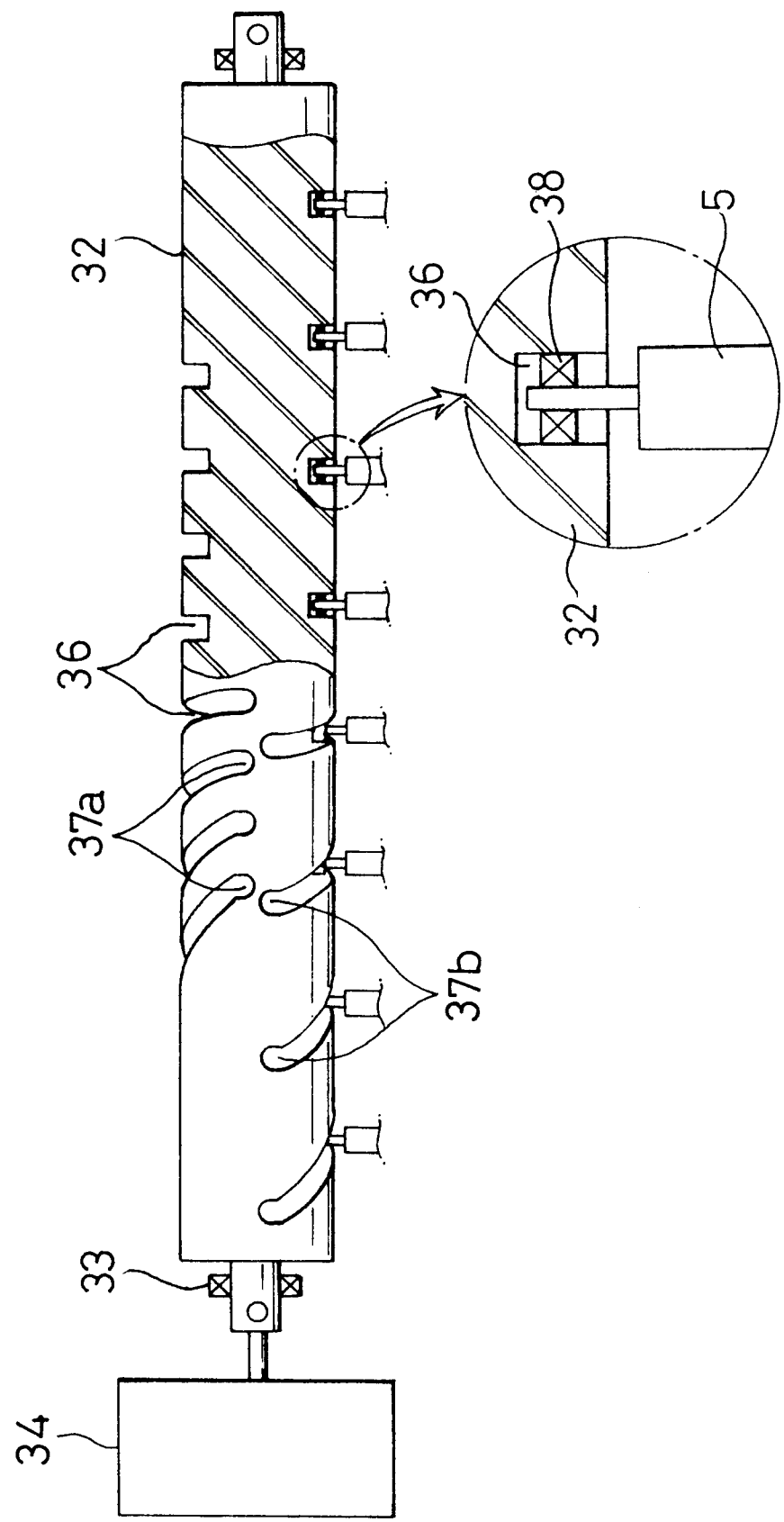
FIG. 10 illustrates a front view with a partial cut away view of a mounted cam shaft.
Figure 11:
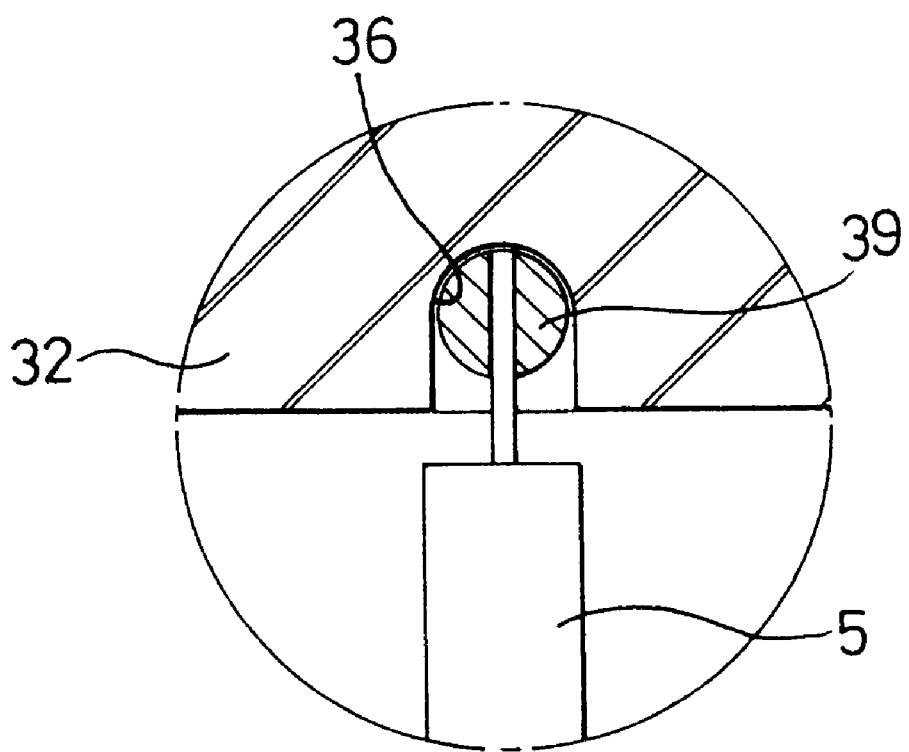
FIG. 11 illustrates a partial cross section showing another embodiment of a cam groove.

The pick-up means for adsorbing a chip 20 in a custom tray or a position determining block includes a pick-up block 5 fitted to one side of the horizontal LM guider 35b for having a space between the pick-up means that becomes greater or smaller as the cam shaft 32 is rotated, and a pick-up 10 hung from the pick-up block for adsorbing the chip as a vacuum is acted in a state a top of the chip is brought into contact therewith. The pick-up 10 each hung from the pick-up blocks 5 for adsorbing the chip has a pitch dependent on an angle (a slope) of each of a plurality of cam grooves 36 formed in the cam shaft 32. If the cam groove 36 forms a too small angle, with a small variation of the pick-up means, either a rotation angle or a diameter of the cam shaft 32 should be set greater. Opposite to this, if the cam groove 36 forms a too great angle, a great load can be put on bearings 38 inserted in the cam groove 36 during movement of the pick-up block, giving an excessive force to the driving means. Therefore, it is the most desirable that an outer circumference of the cam shaft 32 is fully utilized along a pitch of the pick-up block 5 because it will no give the excessive force to the driving means. In one embodiment of the present invention, as shown in FIGS. 8 and 9, the cam shaft 32 has symmetrical cam grooves 36 formed in the outer circumference of the cam shaft 32 in a radial direction. This is for drawing four pick-up means either apart or closer in left and right directions centered on a middle of the cam shaft 32 as the cam shaft 32 is rotated, for reducing a distance of movement of each pick-up means, that can minimize a time period required for adjusting a space between the pick-ups 10. The cam groove 36 in the cam shaft 32 is formed to have a "⌣" section as shown in FIG. 10, for inserting bearings 38 inserted in the pick-up block 5 with contacts of the bearings 38 with inside surfaces of the cam groove 36 assured. This is for minimizing error coming from wear of components caused by friction at portions the pick-up block 5 makes contact with the cam groove 36 when the pick-up block 5 is moved guided by the horizontal LM guider 35a and 35b as the position of the pick-up block 5 in relation to the cam groove is varied due to the cam shaft 32 rotation. However, the cam groove 36 in the cam shaft 32 may be formed to have a "U" section while a ball 39 is fitted at top of the pick-up block 5 as shown in FIG. 11 as another embodiment, for positioning the ball 39 in the cam groove 36. There are set grooves 37a and 37b perpendicular to an axis of the cam shaft 32 at both ends of each cam groove sloped at an angle to the cam shaft 32 in communication to respective cam groove. These are provided for preventing variation of spaces (distances) between the pick-ups 10 coming from fabrication and assembly errors in advance by setting the bearings 38 or balls 39 in the set grooves 37a and 37b in which the pick-up blocks 5 changes no positions in states the pick-ups 10 are either fully drawn apart or close by the driving means.

Figure 14:
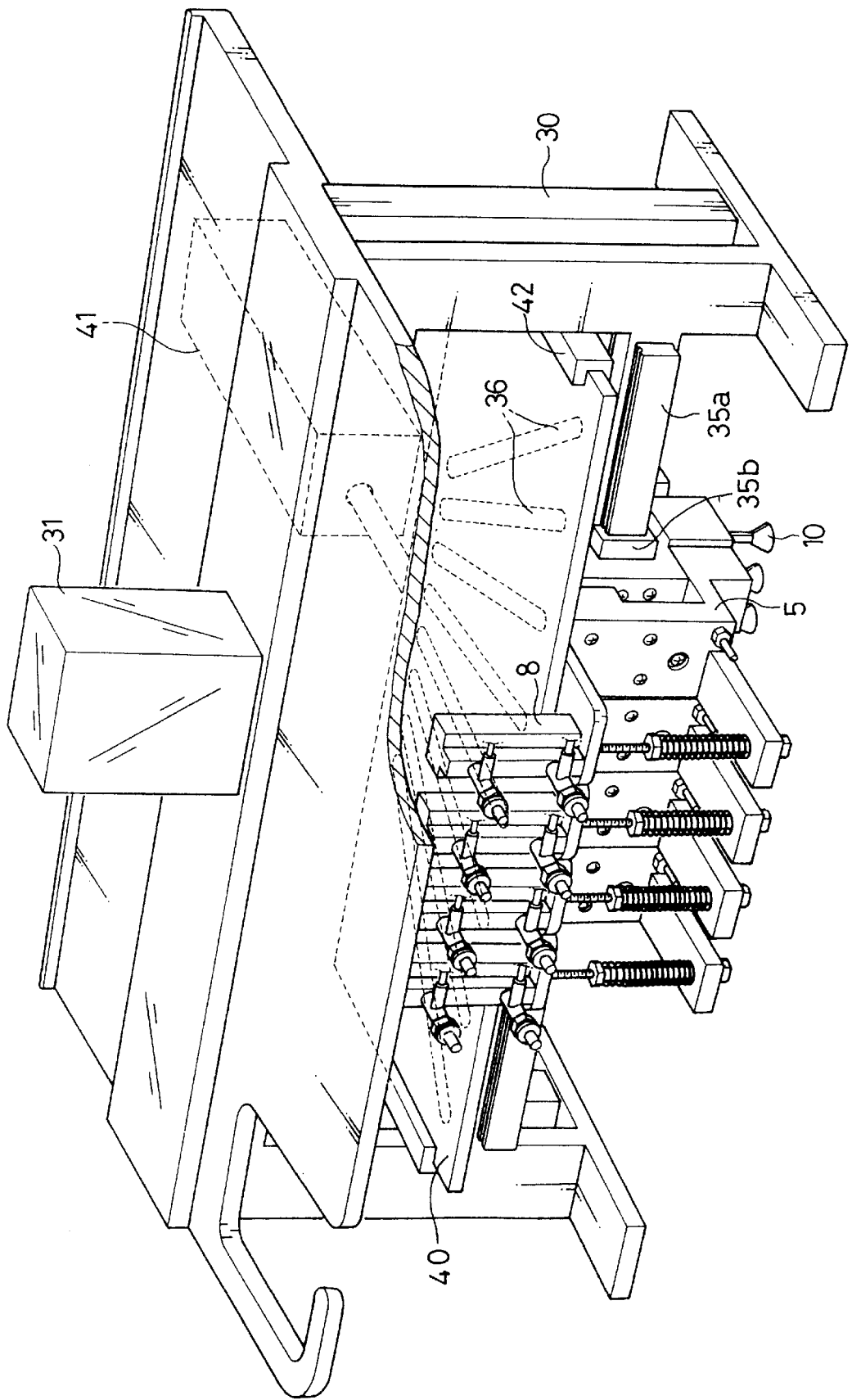

FIG. 14 illustrates a perspective view showing another embodiment of the present invention, wherein a cam plate 40 having cam grooves 36 is applied in place of the cam shaft 32 applied to the first embodiment. In the second embodiment, parts the same with the first embodiment will be given the same reference numerals and explanation on which will be omitted. The cam plate 40 having a plurality of the cam grooves 36 in bottom surface thereof is movably fitted to an elevating plate 30 moving along a mounting plate 28 so that the cam plate 40 makes movement in forward and backward directions guided by guide members 42 according to movement of a driving means of the cylinder 41, thereby adjusting spaces between the pick-up means. That is, there are cam grooves 36 in forms as shown in FIG. 9 formed in the bottom surface of the cam plate 40.

The operation of the present invention having the aforementioned system will be explained.

Figure 12A:
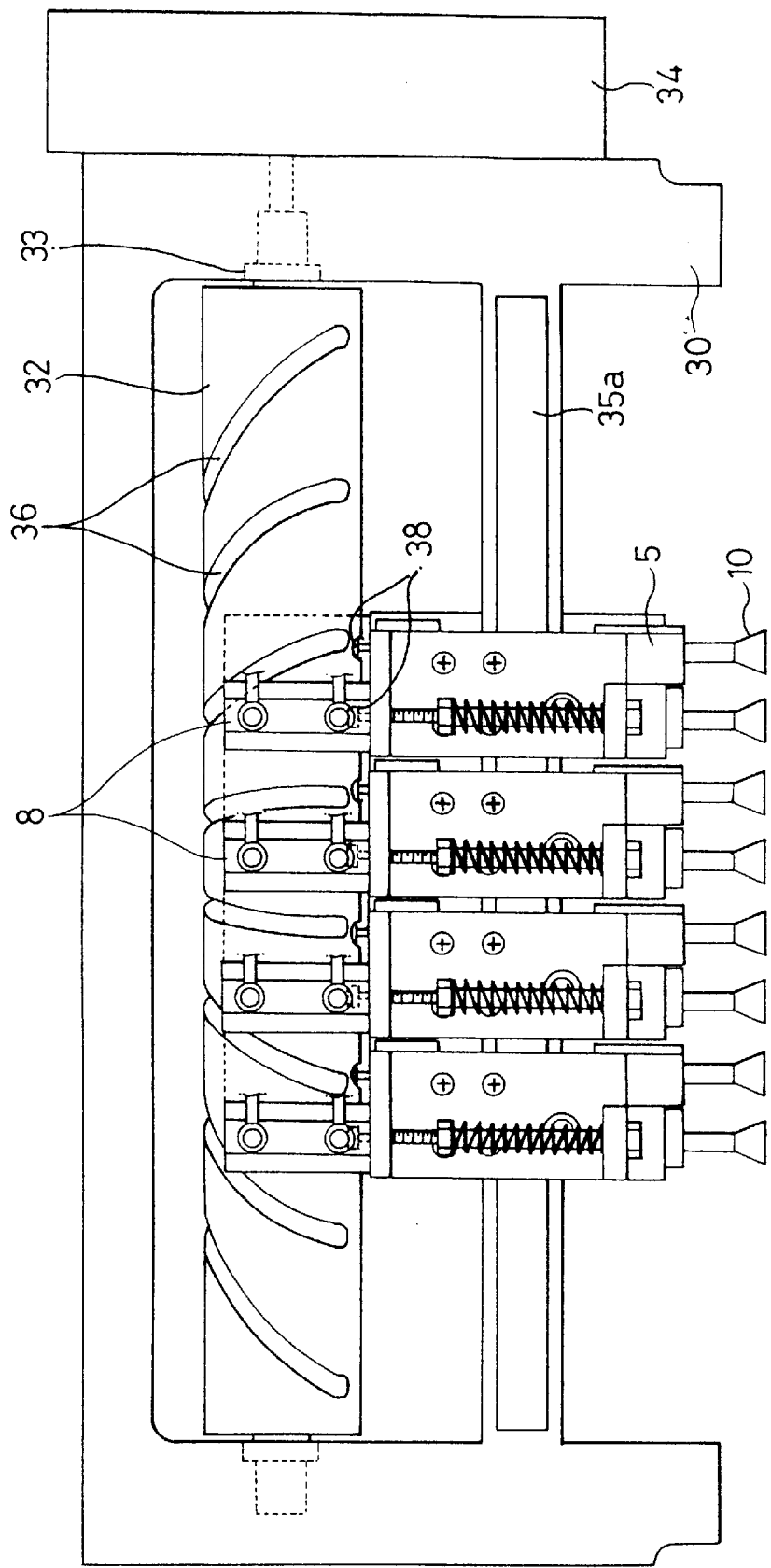

First, in order to adsorb the chips in recesses of the custom tray, the pick-ups 10 exposed through a bottom surfaces of the pick-up blocks 5 are drawn close because a pitch of the recesses of the custom tray is smaller than a pitch of the recesses of the test tray. That is, as shown in FIG. 12a, since the bearing 38 or ball 39 on top of each of the pick-ups 10 is set in a set groove 37a formed to communicate with a starting point of the cam groove 36, the pick-up blocks 5 are drawn close to each other. Under this state, when it is intended to adsorb, transport, and place chips in the custom tray to the recesses in the test tray, the carrier plate 26 is moved along the guide rail 25 and stops at a position over one column of the recesses of the custom tray. Then, alike the background art device, the cylinder 31 fixed to the carrier plate 26 is driven to move the elevating plate 30 downward, the pick-ups 10 of the pick-up means fitted to the elevating plate are brought into contact with top surfaces of the chips in the recesses of the custom tray. Upon exerting a vacuum to the pick-ups 10, the chips in the one column of recesses of the custom tray are adsorbed. After the chips are adsorbed to the pick-ups, an operation opposite to the foregoing operation is made, elevating the elevating plate 30 to an initial state as well as moving the carrier plate 26 toward the position determining block along the guide rails 25. During the carrier plate 26 is moved toward the position determining block side, the rotating cylinder 34, a driving means, is driven for rotating the cam shaft 32 or the cylinder 41 is driven for pulling the cam plate 40, thereby varying positions of the cam grooves 36 which is formed to maintain a constant angle. That is, as the bearings 38 or balls 39 inserted in the cam grooves 36 vary their positions, the pick-up blocks 5 are drawn apart from each other. According to this, as shown in FIG. 12b, spaces between the pick-ups 10 hung from bottom of the pick-up blocks 5 are drawn apart, spaces between the chips adsorbed to the pick-ups become the same with the spaces between the recesses of the position determining blocks. In the foregoing operations, as the bearings 38 or balls 39 on top of the pick-up blocks 5 are rotated in moving in right and left directions along the cam grooves 36, wear of the cam grooves is minimized, allowing the spaces between the pick-ups 10 always constant. That is, by moving the pick-ups 10 toward the position determining block in a state the pick-ups 10 are drawn apart identical to a pitch of the recesses in the test tray, and releasing the vacuum acted on the pick-ups 10 in a state the elevating plate 30 is positioned at a bottom dead point, the chips adsorbed to the pick-ups 10 are dropped into the recesses in the position determining block, determining positions of the chips exactly, loading of the chips is completed.

In the meantime, the operation of adsorbing chips from the recesses of the test tray, and transporting chips to the custom tray after classified according to a test result is carried out by moving the pick-up blocks 5 having pick-ups 10 hung therefrom in a state drawn apart from each other toward the test tray, adsorbing top of chips having a test completed, drawing spaces between the pick-up blocks 5 closer, and moving toward the custom tray. That is, the operation is reverse of the aforementioned operation, of which explanation will be omitted.

The present invention as has been explained has the following advantages.

First, the adjustment of spaces between pick-up blocks 5 each having a pick-up 10 hung therefrom using the cam shaft 32 or the cam plate 40 having cam grooves formed therein in place of the link system allows occurrence of no cumulative tolerance in fabrication and assembly.

Second, the easy assembly, only requiring insertion of the bearings 38 or balls 39 coupled to the pick-up blocks 5 into the cam grooves 36 in the cam shaft 32 or cam plate 40, allows to maximize a productivity with respect to assembly.

Third, the simple structure, with substantial reduction of a possibility of malfunction from defective components, allows a long lifetime.

Fourth, since changes of parts due to wear of bearings 38 and balls 39 are easy with minimum change times, a rate of operation of the expensive equipment can be maximized.

It will be apparent to those skilled in the art that various modifications and variations can be made in the device for adjusting a space between chips in a semiconductor chip tester of the present invention without departing from the spirit or scope of the invention. Thus, it is intended that the present invention cover the modifications and variations of this invention provided they come within the scope of the appended claims and their equivalents.

What is claimed is:

1. A device for adjusting a space between chips in a semiconductor chip tester, comprising:

a carrier plate mounted movable along a horizontal guide rail;

a mounting plate fixed to the carrier plate;

an elevating plate mounted on the mounting plate movable in up and down direction by a vertical LM (linear motion) guider;

a cam shaft rotatably mounted on the elevating plate, the cam shaft having a plurality of cam grooves formed in a radial direction in an outer circumferential surface;

driving means for rotating the cam shaft; and a plurality of pick-up means each fitted movable in a horizontal direction by a horizontal LM guider in a state a top of each of the pick-up means is inserted in one of the cam grooves;

wherein each of the cam grooves includes set grooves at both ends thereof to be in communication therewith.

2. A device for adjusting a space between chips in a semiconductor chip tester comprising a carrier plate mounted movable along a horizontal guide rail;

a mounting plate fixed to the carrier plate;

an elevating plate mounted on the mounting plate movable in up and down direction by a vertical LM (linear motion) guider;

a cam plate mounted on the elevating plate movable in forward and backward directions, the cam plate having a plurality of cam grooves formed in a radial direction in a bottom surface thereof;

guide means for guiding a movement of the cam plate in the forward and backward direction;

driving means fixed to one side of the cam plate for moving the cam plate in the forward and backward directions;

a plurality of pick-up means each fitted movable in a horizontal direction by a horizontal LM guider in a state a top of each of the pick-up means is inserted in one of the cam grooves; and wherein the cam groove in the cam shaft has a "⌊⌋" section.

3. A device for adjusting a space between chips in a semiconductor chip tester, comprising a carrier plate mounted movable along a horizontal guide rail;

a mounting plate fixed to the carrier plate;

an elevating plate mounted on the mounting plate movable in up and down direction by a vertical LM (linear motion) guider;

a cam plate mounted on the elevating plate movable in forward and backward directions, the cam plate having a plurality of cam grooves formed in a radial direction in a bottom surface thereof;

guide means for guiding a movement of the cam plate in the forward and backward direction;

driving means fixed to one side of the cam plate for moving the cam plate in the forward and backward directions;

a plurality of pick-up means each fitted movable in a horizontal direction by a horizontal LM guider in a state a top of each of the pick-up means is inserted in one of the cam grooves; and wherein the cam groove in the cam shaft has a "U" section.

4. A device as claimed in claim 3, wherein the pick-up means has a ball coupled to a top portion thereof for inserting in the cam groove.

* * * * *